United States Patent
Jang et al.

(10) Patent No.: US 8,838,050 B2
(45) Date of Patent: Sep. 16, 2014

(54) POWER AMPLIFIER FOR TIME DIVISION MULTIPLE ACCESS

(75) Inventors: Dae Seok Jang, Gyeonggi-do (KR); Youn Suk Kim, Gyeonggi-do (KR); Ki Joong Kim, Gyeonggi-do (KR); Sung Jae Yoon, Gyeonggi-do (KR); Chul Hwan Yoon, Gyeonggi-do (KR)

(73) Assignee: Samsung Electro-Mechanics Co., Ltd., Gyeonggi-Do (KR)

( * ) Notice: Subject to any disclaimer, the term of this patent is extended or adjusted under 35 U.S.C. 154(b) by 224 days.

(21) Appl. No.: 13/602,007

(22) Filed: Aug. 31, 2012

(65) Prior Publication Data

US 2013/0058322 A1   Mar. 7, 2013

(30) Foreign Application Priority Data

Sep. 1, 2011   (KR) .................. 10-2011-0088603

(51) Int. Cl.
*H04B 7/212* (2006.01)
*H04B 1/04* (2006.01)
*H03F 3/72* (2006.01)

(52) U.S. Cl.
CPC .............. *H04B 7/212* (2013.01); *H03F 3/72* (2013.01); *H03F 2203/7209* (2013.01)
USPC .............. 455/127.1; 455/127.3; 455/127.4; 370/347

(58) Field of Classification Search
USPC ......... 455/127.1, 127.3, 127.4, 13.4, 522, 91, 455/115.1, 127.2, 130, 552.1, 553.1; 370/347; 330/154, 165, 171
See application file for complete search history.

(56) References Cited

U.S. PATENT DOCUMENTS

| 7,839,218 | B2* | 11/2010 | Shimamoto et al. | 330/298 |
| 7,936,229 | B2* | 5/2011 | Akhtar et al. | 332/145 |
| 8,159,282 | B2* | 4/2012 | Katoh et al. | 327/427 |
| 8,160,275 | B2* | 4/2012 | Zhu et al. | 381/104 |
| 8,280,325 | B2* | 10/2012 | Zolfaghari | 455/127.3 |
| 8,571,498 | B2* | 10/2013 | Khlat | 455/127.3 |
| 8,731,490 | B2* | 5/2014 | Smith et al. | 455/114.1 |
| 2008/0136559 | A1* | 6/2008 | Takahashi et al. | 333/167 |
| 2010/0182755 | A1* | 7/2010 | Maejima et al. | 361/748 |
| 2010/0295599 | A1* | 11/2010 | Uehara et al. | 327/355 |
| 2011/0210787 | A1* | 9/2011 | Lee et al. | 330/126 |
| 2014/0009208 | A1* | 1/2014 | Smith | 327/391 |
| 2014/0015603 | A1* | 1/2014 | Scott et al. | 330/126 |
| 2014/0038675 | A1* | 2/2014 | Khlat et al. | 455/574 |
| 2014/0049321 | A1* | 2/2014 | Gebeyehu et al. | 330/279 |
| 2014/0073267 | A1* | 3/2014 | Cabanillas et al. | 455/79 |

FOREIGN PATENT DOCUMENTS

KR   10-2005-0100300 A   10/2005

* cited by examiner

*Primary Examiner* — Pablo Tran
(74) *Attorney, Agent, or Firm* — Bracewell & Giuliani LLP; Brad Y. Chin

(57) ABSTRACT

Disclosed herein is a power amplifier for time division multiple access. The power amplifier for time division multiple access includes: power amplifiers power-amplifying input transmission signals and outputting the amplified signals; a power control unit using a time division multiple access type to control amplification of the power amplifiers; a switching unit formed at output terminals of the power amplifiers and the power control unit and outputting the amplified signals to an antenna based on a switching pass determined by the power control unit; and a timing control unit formed at an input terminal of the power control unit and determining turn-on time of a second signal by a level of an output signal generated by comparing a first signal with reference voltage.

10 Claims, 3 Drawing Sheets

126

126

POWER AMPLIFIER FOR TIME DIVISION MULTIPLE ACCESS

CROSS REFERENCE(S) TO RELATED APPLICATIONS

This application claims the benefit under 35 U.S.C. Section 119 of Korean Patent Application Serial No. 10-2011-0088603, entitled "Power Amplifier for Time Division Multiple Access" filed on Sep. 1, 2011, which is hereby incorporated by reference in its entirety into this application.

BACKGROUND OF THE INVENTION

1. Technical Field

The present invention relates to a power amplifier, and more particularly, to a power amplifier for time division multiple access having a circuit capable of calibrating timing.

2. Description of the Related Art

A power amplifier for time division multiple access is applied to a mobile communication terminal and a base station system that can implement two-way transmission by time division and secure transmission and reception separation so as to transmit signals at high speed.

The power amplifier for time division multiple access requires a technology of switching power-amplified RF signals so as to secure isolation at the time of the two-way transmission of the time division multiple access transmitting and receiving signals at high speed. As the related art, there is a technology of electrically connecting a plurality of single pole double throw (SPDT) switches to output terminals of a plurality of amplifiers.

Meanwhile, the power amplifier for time division multiple access requires a timing control so as to satisfy time division standards for each terminal and receives a timing control signal from a communication chip set so as to satisfy a transmission standard.

In order to receive the timing control signal, the power amplifier for time division multiple access needs to satisfy the transmission standard under the provided timing conditions, in particular, satisfy power vs time (PVT) to all the power control levels (hereinafter, referred to as "PCLs") under the provided timing conditions. In order to satisfy the PVT, the PCL should not deviate from a time mask.

However, a case in which the power amplifier cannot satisfy the PVT items to all the PCLs according to a location setting of a power logic enable signal that is a reference signal has often occurred.

In particular, the case in which the power amplifier satisfies the PVT in a low PCL but becomes spec out in a high PCL has occurred and as a result, performance of the power amplifier for time division multiple access may be degraded.

SUMMARY OF THE INVENTION

An object of the present invention is to provide a power amplifier for time division multiple access and an object of the present invention is to provide a power amplifier for time division multiple access capable of improving performance by satisfying PVT items in all output power levels.

According to an exemplary embodiment of the present invention, there is provided a power amplifier for time division multiple access including: power amplifiers power-amplifying input transmission signals and outputting the amplified signals; a power control unit using a time division multiple access type to control amplification of the power amplifiers; a switching unit formed at output terminals of the power amplifiers and the power control unit and outputting the amplified signals to an antenna based on a switching pass determined by the power control unit; and a timing control unit formed at an input terminal of the power control unit and determining turn-on time of a second signal by a level of an output signal generated by comparing a first signal with reference voltage.

DESCRIPTION OF THE PREFERRED EMBODIMENTS

Hereinafter, exemplary embodiments of the present invention will be described in detail with reference to the accompanying drawings. However, this is only by way of example and therefore, the present invention is not limited thereto.

When technical configurations known in the related art are considered to make the contents obscure in the present invention, the detailed description thereof will be omitted. Further, the following terminologies are defined in consideration of the functions in the present invention and may be construed in different ways by the intention of users and operators. Therefore, the definitions thereof should be construed based on the contents throughout the specification.

As a result, the spirit of the present invention is determined by the claims and the following exemplary embodiments may be provided to efficiently describe the spirit of the present invention to those skilled in the art.

Hereinafter, a power amplifier for time division multiple access according to exemplary embodiments of the present invention will be described with reference to the accompanying drawings.

Figure 1:
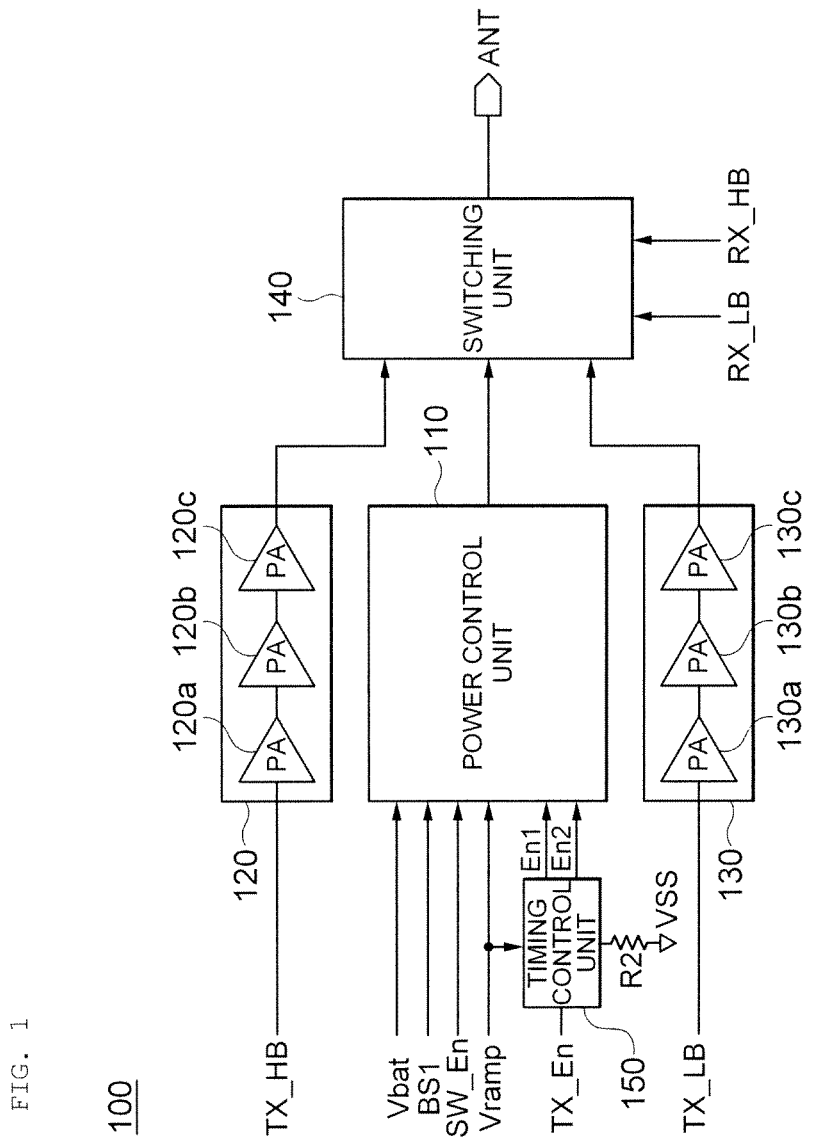
FIG. 1 is a configuration diagram showing a power amplifier for time division multiple access according to an exemplary embodiment of the present invention.

FIG. 1 is a configuration diagram showing a power amplifier for time division multiple access according to an exemplary embodiment of the present invention.

As shown in FIG. 1, a power amplifier 100 for time division multiple access according to an exemplary embodiment of the present invention includes a power control unit 110, a first power amplifier 120, a second power amplifier 130, a switching unit 140, and a timing control unit 150.

The power control unit 110 may use an Europe type (GSM: Global System For Mobile Communication) to which a time division multiple access (TDMA) type is applied to control on-off and amplifications of first and second power amplifiers 120 and 130.

In more detail, the power control unit 110 may receive a main power signal Vbat, a first enable signal TX_En, a second enable signal SW_En, a band select signal BS1, and an output power level control signal Vramp to control the amplifications of the first and second power amplifiers 120 and 130.

In addition, the power control unit 110 may combine the first enable signal TX_En, the second enable signal SW_En, and the band select signal BS1 that are input to determine a switching pass as shown in the following [Table 1] and provide the determined switching pass to the switching unit 140.

TABLE 1

| Mode | SW_En | SW_En | BS1 |
|---|---|---|---|
| RX_LB | 1 | 0 | 0 |
| RX_HB | 1 | 0 | 1 |
| TX_LB | 1 | 1 | 0 |
| TX_HB | 1 | 1 | 1 | in the exemplary embodiment of the present invention, the first enable signal TX_En is a power logic enable signal that enables the power control unit 110 and the second enable signal SW_En is a switch enable signal that enables the switching unit 140.

The first power amplifier 120 is three-stage high frequency power amplifiers 120a, 120b, and 120c and is disposed over the power control unit 110.

As such, the first power amplifier 120 may amplify a first transmission signal TX_HB of a high frequency band input from a high frequency signal input port and provides the amplified first transmission signal TX_HB to the switching unit 140.

Here, the first transmission signal TX_HB of the high frequency band may be, for example, a signal of 1720 to 1910 MHz.

The second power amplifier 130 is three-stage low frequency power amplifiers 130a, 130b, and 130c and is disposed under the power control unit 110.

As such, the second power amplifier 130 may amplify a second transmission signal TX_LB of a low frequency band input from a low frequency signal input port and provides the amplified second transmission signal TX_LB to the switching unit 140.

Here, the second transmission signal TX_LB of the low frequency band may be, for example, a signal of 824 to 915 MHz.

Meanwhile, as described above, the exemplary embodiment of the present invention describes that the first power amplifier 120 is the high frequency power amplifier and the second power amplifier 130 is the low frequency power amplifier, but is not limited thereto. Therefore, the first power amplifier 120 can be changed to the low frequency power amplifier and the second power amplifier 130 can be changed to the high frequency power amplifier.

The switching unit 140 outputs the transmission signals TX_LB and TX_HB output from the first and second power amplifiers 120 and 130, respectively and outputs any one of reception signals RX_LB and RX_HB input to an input pin of the switching unit 140, which may be in turn connected to an antenna ANT.

In this case, the switching pass of the switch unit 140 may be determined as shown in the above [Table 1] by the power control unit 110 and may output any one signal based on the results.

The timing control unit 150 according to the exemplary embodiment of the present invention generates the first enable signal TX_En as first and second timing control signals EN1 and EN2 so as to satisfy power vs time (PVT) to all the power control levels (PCLs), thereby controlling turn-on time. As a result, the timing control unit 150 can control the PCLs so as not to deviate from a time mask.

As such, the timing control unit 150 is formed in front of the power control unit 110 and receives the output power level control signal Vramp and the first enable signal TX_En to generate the first and second timing control signals EN1 and EN2 and provide the generated first and second timing control signals EN1 and EN2 to the power control unit 110. Hereinafter, the timing control unit 150 according to the exemplary embodiment of the present invention will be described below with reference to FIG. 2.

Meanwhile, although not shown in the drawings of the present invention, matching circuits of the power amplifier may be formed at the output terminals of the first and second power amplifiers 120 and 130 and the output terminal of the switching unit 140, respectively.

As such, the power amplifier 100 for time division multiple access according to the exemplary embodiment of the present invention controls a turn-on timing of the power logic enable signal, that is, the first enable signal TX_En using the timing control unit 150 so as to satisfy the PVT to all the PCLs, thereby improving the performance.

Figure 2:
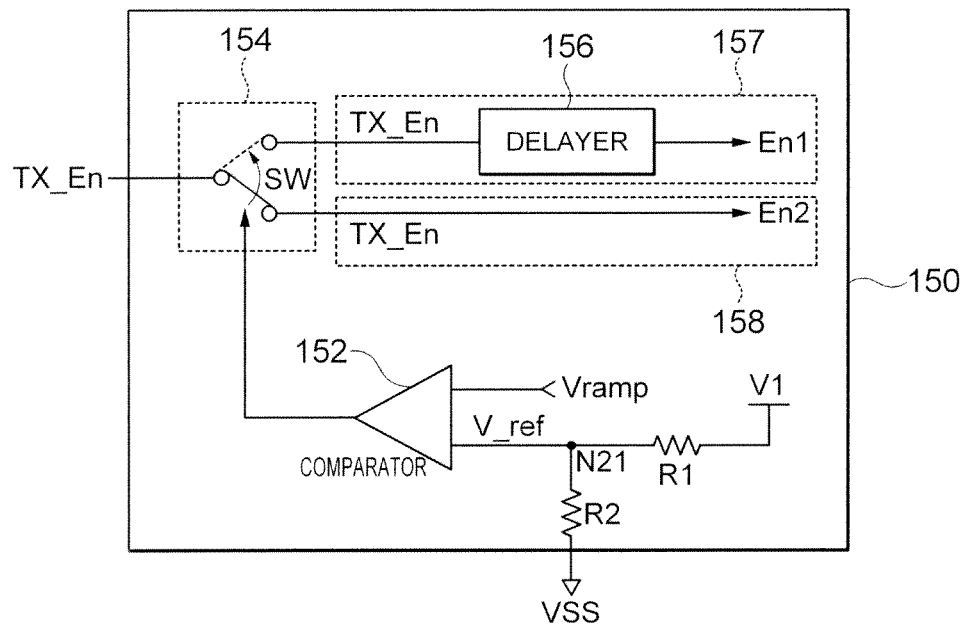
FIG. 2 is a detailed circuit diagram showing a timing control unit according to a first exemplary embodiment of the present invention.

FIG. 2 is a detailed circuit diagram showing the timing control unit of FIG. 1.

As shown in FIG. 2, the timing control unit 150 according to the exemplary embodiment of the present invention may be configured to include a comparator 152, a pass selector 154, and a delayer 156.

The comparator 152 may compare the output power level control signal Vramp with reference voltage Vref to control the pass selector 154. Here, as the comparator 152 according to the exemplary embodiment of the present invention, for example, an OP-amp may be used.

In more detail, the comparator 152 may generate a high-level output signal VC and provide the generated high-level output signal VC to the pass selector 154 when the voltage of the output power level control signal Vramp is the reference voltage Vref or more.

On the other hand, the comparator 152 may generate a low-level output signal VC and provide the generated low-level output signal VC to the pass selector 154 when the voltage of the output power level control signal Vramp is below the reference voltage Vref.

Here, in the exemplary embodiment of the present invention, the reference voltage Vref may use a voltage divider to divide and generate internal voltage V1.

The voltage divider according to the exemplary embodiment of the present invention may be formed by an internal resistor R1 and an external resistor R2, wherein the reference voltage Vref is determined by a node N23 formed between the internal resistor R1 and the external resistor R2.

The pass selector 154 may selectively output the first enable signal TX_En to a first pass 157 or a second pass 158 in response to a level of the output signal VC output from the comparator 152.

Figure 3:
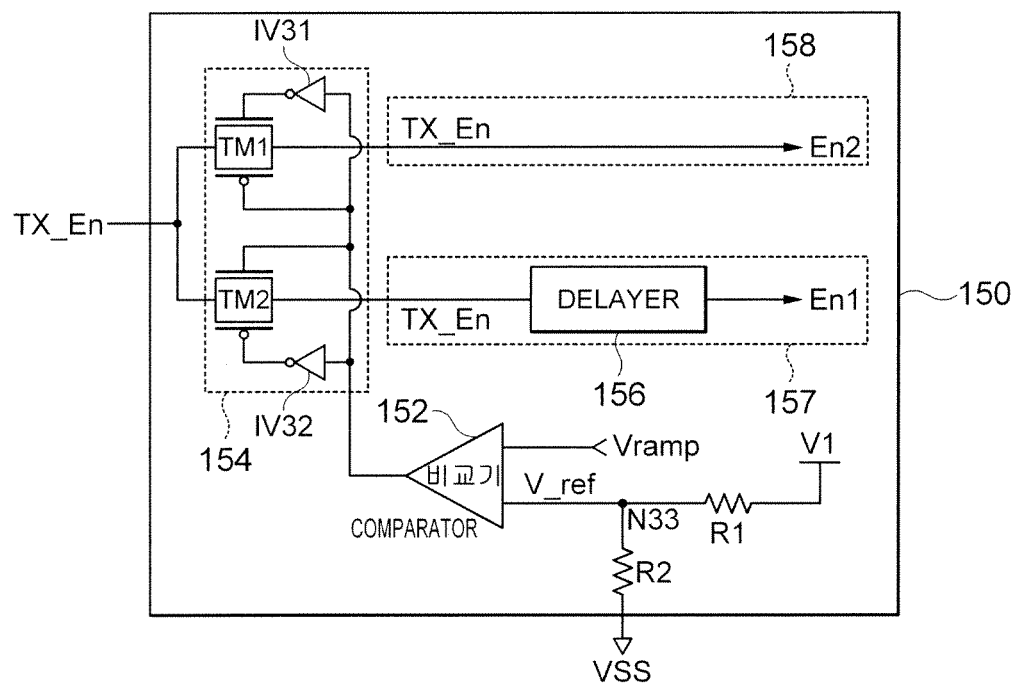
FIG. 3 is a detailed circuit diagram showing a timing control unit according to a second exemplary embodiment of the present invention.

In this case, the pass selector 154 may be formed of, for example, a switch, but is not limited thereto. Therefore, as shown in FIG. 3, the pass selector 154 may be formed of a MOS transistor and may be formed of all the devices that can perform a switching function.

Here, the first pass 157, which is a pass including the delayer 156, a pass outputting the first timing control signal En1. The second pass 158, which is a pass not including the delayer 156, a pass outputting the second timing control signal En2.

In more detail, when the pass selector 154 receives the high-level output signal VC from the comparator 152, the pass selector 154 may switch the second pass 158 to output the second timing control signal En1 outputting the first enable signal TX_En as it is.

On the other hand, when the pass selector 154 receives the low-level output signal VC from the comparator 152, the pass selector 154 may switch the first pass 157 to output the first enable signal TX_En. However, the output first enable signal TX_En may be generated and output as the first timing control signal En1 of which the turn-on time is changed by the delayer 156.

Figure 4A:
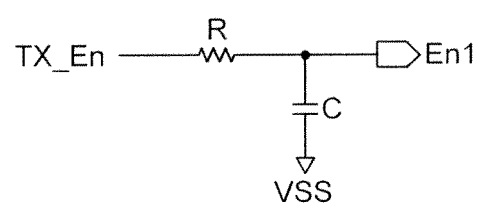
FIG. 4A is a detailed circuit diagram showing a delayer according to a first exemplary embodiment of the present invention.
Figure 4B:
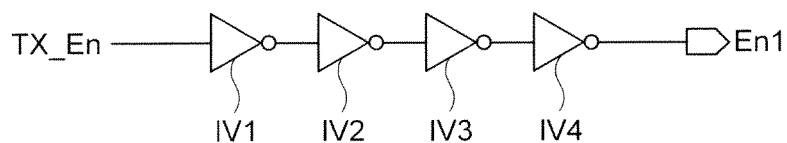
FIG. 4B is a detailed circuit diagram showing a delayer according to a second exemplary embodiment of the present invention.

The delayer 156 is formed at the first pass 157, and in particular, may receive the first enable signal TX_En and delay the received first enable signal TX_En for a predetermined time to be generated as the first timing control signal En1. In this case, the delayer 156 is configured of an RC circuit using a capacitor C and a resistor R as shown in FIG. 4A or may be formed by connecting a plurality of inverters IV1, IV2, IV3, and IV4 in series as shown in FIG. 4B.

As described above, the timing control unit 150 according to the exemplary embodiment of the present invention uses the output power level control signal Vramp to move the first enable signal TX_En1 to the first pass 157 or the second pass 158, thereby controlling the turn-on time of the first enable signal TX_En.

Thereby, the power amplifier for time division multiple access satisfies the PVT to all the PCLs, thereby improving the performance of the power amplifier for time division multiple access.

The exemplary embodiments of the present invention relate to the power amplifier for time division multiple access. The power amplifier for time division multiple access according to the exemplary embodiments of the present invention can satisfy the PVT to all the PCLs by controlling the turn-on timing of the power logic enable signal, that is, the first enable signal by using the timing control unit, thereby improving the performance.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Accordingly, such modifications, additions and substitutions should also be understood to fall within the scope of the present invention.

What is claimed is:

1. A power amplifier for time division multiple access, comprising:
   power amplifiers power-amplifying input transmission signals and outputting the amplified signals;
   a power control unit using a time division multiple access type to control amplification of the power amplifiers;
   a switching unit formed at output terminals of the power amplifiers and the power control unit and outputting the amplified signals to an antenna based on a switching pass determined by the power control unit; and
   a timing control unit formed at an input terminal of the power control unit and determining turn-on time of a second signal by a level of an output signal generated by comparing a first signal with reference voltage.

2. The power amplifier according to claim 1, wherein the switching unit receives reception signals and selectively switches the amplified signals or the reception signals based on the switching pass so as to be output to the antenna.

3. The power amplifier according to claim 1, wherein the first signal is an output level control signal.

4. The power amplifier according to claim 1, wherein the second signal is a power logic enable signal that enables the power control unit.

5. The power amplifier according to claim 1, wherein the timing control unit includes:
   a comparator comparing the first signal with the reference voltage to output the output signal;
   a pass selector selectively switching the second signal to a first pass or a second pass based on the output signal output from the comparator; and
   a delayer formed at the first pass and generating a first timing control signal generated by delaying the second signal output to the first pass for a predetermined time and providing the generated first timing control signal to the power control unit.

6. The power amplifier according to claim 5, wherein the first pass includes a delayer generating a second timing control signal by applying the second signal output from the pass selector as it is and providing the generated second timing control signal to the power control unit.

7. The power amplifier according to claim 5, wherein the reference voltage is voltage obtained by receiving internal voltage within the power amplifier for time division multiple access and dividing the received internal voltage into 1/n using a voltage divider.

8. The power amplifier according to claim 7, wherein: the voltage divider is configured of an internal resistor and an external resistor.

9. The power amplifier according to claim 5, wherein the delayer is configured of an RC circuit.

10. The power amplifier according to claim 5, wherein the delayer is configured by connecting a plurality of inverters in series.

* * * * *